United States Patent [19]

Allen

[11] Patent Number: 5,255,051
[45] Date of Patent: Oct. 19, 1993

[54] SMALL FIELD SCANNER

[75] Inventor: Paul C. Allen, Beaverton, Oreg.

[73] Assignee: Etec Systems, Inc., Beaverton, Oreg.

[21] Appl. No.: 676

[22] Filed: Jan. 5, 1993

Related U.S. Application Data

[62] Division of Ser. No. 720,205, Jun. 24, 1991.

[51] Int. Cl.[5] .................. G03B 27/42; G03B 27/32
[52] U.S. Cl. .......................... 355/77; 355/51; 355/53
[58] Field of Search .................. 355/51, 53, 77; 356/401

[56] References Cited

U.S. PATENT DOCUMENTS

| | | | |
|---|---|---|---|
| 4,688,932 | 8/1987 | Suzuki | 355/51 |
| 4,708,466 | 11/1987 | Isohata et al. | 355/53 |
| 4,878,086 | 10/1989 | Isohata | 355/77 |
| 4,924,257 | 5/1990 | Jain | 355/53 |
| 4,933,714 | 6/1990 | Buckley et al. | 355/53 X |
| 4,958,160 | 9/1990 | Ito et al. | 356/401 X |

*Primary Examiner*—Richard A. Wintercorn
*Attorney, Agent, or Firm*—Blakely, Sokoloff, Taylor & Zafman

[57] ABSTRACT

A method and apparatus for printing arbitrarily large circuit patterns using small field optics. The use of small field imaging optics allows the use of high NA lens designs capable of printing smaller geometries than otherwise would be possible. The field size in a first axis is extended by scanning an object and image past the lens; the field size in a second axis is extended by stitching the scans together in an overlapped fashion. This overlapped printing technique averages many random and systematic errors and allows the placement of field adjacencies within die boundaries. The effective field size of such a system is limited only by reticle size and stage mechanics. The apparatus further includes error correction loops for enhancing stage synchronization accuracy and for reducing field adjacency errors.

3 Claims, 7 Drawing Sheets

FIG_1

FIG_2A

FIG_2C

FIG_2B

FIG_2D

FIG_3

FIG_4

FIG_5

FIG_7A

FIG_7D

FIG_7B

FIG_7E

FIG_7C

SMALL FIELD SCANNER

This is a divisional of application Ser. No. 07/720,205, filed Jun. 24, 1991.

BACKGROUND OF THE INVENTION

1. Field of the Invention

This invention relates to the field of microlithography, in particular to the printing of integrated circuit patterns with a feature size of less than 1 micron.

2. Prior Art

In the photo-lithographic fabrication of integrated circuits, films sensitive to radiant or particle energy are exposed in predetermined patterns to define circuit features. In some cases, the energy is passed through masks which define the patterns, thereby selectively exposing a photoresist film on a semiconductor body. In other instances, the film is on a mask substrate and the film is exposed as a step in the making of the mask. Other times the direction or pattern of the radiant energy itself is controlled to define patterns in the film. This can be done as part of making a mask or reticle or to directly "write" onto the photoresist film covering a semiconductor wafer.

As integrated circuits are developed that are more densely populated with devices, the feature size of the discrete devices within the integrated circuit become smaller. This is important in both the making of masks or reticles or writing onto the photoresist film covering a semiconductor wafer. To aid in increasing the density, the ability to print integrated circuit patterns with small feature sizes is necessary. The tool of choice for printing integrated circuit patterns with feature sizes between 0.5 and 1.5 microns is the reduction step and repeat camera, commonly known as a stepper. A step and repeat camera utilizes reduction optics to reduce a reticle image for writing directly onto a photoresist film covering a wafer. The writing occurs in a stepwise, i.e. move reticle, expose and repeat fashion across the wafer. The step and repeat camera has the drawbacks of being relatively slow and having a relatively small field size (limited by the design of the lens).

A second known technique for printing a circuit pattern on a wafer is through scanning. In a scanning system, a radiant energy source is projected through a mask and an arc-shaped aperture to create a well corrected image field. The field image is then directed towards a semiconductor wafer covered by a photoresist film. The reticle and semiconductor wafer are concurrently scanned through the arc-shaped object and image fields, so that the entire reticle image is printed onto the wafer. No reduction optics are utilized. Scanning systems generally are faster than step and repeat cameras, but are not suitable for printing wafers with small feature sizes.

As feature sizes have shrunk, die sizes have gradually increased (die refers to the individual integrated circuit component or chip prior to it being packaged). For example, it is projected that a memory device having a capacity of one gigabyte will require a die size of 30 mm per edge. For known photolithography tools, the die size is dependant on the image field size of the tools' optics. The dual constraints of higher resolution and constant, if not increasing, field sizes have made the design and manufacture of reduction lenses, as used by step and repeat cameras, ever more difficult and costly. It is anticipated that in the near future, it may not be economically feasible to produce large field lenses capable of resolving the 0.25 micron features that will be required for future generations of integrated circuits.

One known approach that addresses the dual constraints discussed above is embodied by the Perkin-Elmer Micrascan ™ system. This system combines the step and repeat and scanning techniques and uses primarily reflective optics in a 'step and scan' fashion to achieve a 4 to 1 reduction ratio. 'Step and scan' refers to a technique where individual exposure fields are scanned past an image field of a reticle created by an illumination system. When the scan is complete, the system steps to the next field to be scanned. In the Micrascan system, the reticle will be positioned on a reticle stage and the wafer or mask will be positioned on a wafer stage. Since a 4 to 1 reduction is occurring, the reticle stage will be moving at a speed 4 times as great as the wafer stage. The optics in the Micrascan system are designed to produce a scanned field size of 20×32.5 mm when utilizing 6×6 inch reticles. A well corrected arcuate field that spans 20 mm on a first fixed axis (the width of an exposure field) is scanned in a second axis to produce an effective image length of up to 50 mm (limited primarily by available stage travel). This approach removes the field size constraints on one axis only. The Micrascan system is described in detail in an article entitled "Step and scan: A systems overview of a new lithography tool", authored by Jere D. Buckley and Charles Karatzas, appearing in SPIE Vol. 1088 Optical/Laser Microlithography II Pages 424–433 (1989).

A second known system is described in U.S. Pat. No. 4,924,257, Jain, entitled "Scan and Repeat High Resolution Projection Lithography System", herein incorporated by reference. The system in the Jain reference provides for extending the field size along two axis. The system in the Jain reference utilizes a hexagonal shaped image field that is scanned in a manner to create complementary exposures in an overlap region between adjacent scans. Utilizing this scanned overlapping technique, the effective field image is created along both axis.

The system in Jain relies on the synchronization of the reticle and wafer stages to insure that the proper image field is presented to the wafer. Using this technique, stage synchronization must be accurate well below 0.1 microns in order to accommodate anticipated feature sizes. It would be desirable to provide a scanning lithography system where the proper image field is presented to the wafer by means where corrections may take place in the optical path. Such a system would have the benefits of insuring accuracy while relaxing stringent stage synchronization requirements.

A third known system described in U.S. Pat. No. 4,879,605, Warkentin et al., entitled "Rasterization System Utilizing an Overlay of Bit-Mapped Low Address Resolution Databases", assigned to assignee of the present invention, provides for overlapped multiple-pass printing of a circuit pattern. In the Warkentin reference, a high address resolution database representing a high address resolution pattern is converted into a plurality of low address resolution databases. Multiple-passes utilizing the low address resolution databases are used to print the low address resolution databases resulting in a high resolution printed pattern. The method described in the Warkentin reference provides for the reduction of butting, critical dimension and placement errors.

It is an object of the present invention to develop a microlithography system that scans using small field refractive optics and which is capable of extending the field size in both axes. Small field refractive optics are desirable because of their suitability for high Numerical Aperture (NA) lenses (which provides for greater resolution). It is desirable to extend the field size along both axes to enable larger and more practical die sizes and shapes. It is a further object of the present invention to provide a highly accurate microlithography tool that will precisely place a reticle image field on a wafer through means found in the optical path.

SUMMARY

A method and apparatus for generating a pattern on a substrate, where the pattern is defined by a reticle and the substrate includes a film responsive to radiant energy, is disclosed. Typically, the patterns are circuit patterns and the substrate is a semiconductor wafer. In any event, the present invention is comprised essentially of means for creating radiant energy, means for dispersing the radiant energy in a beam of a predetermined shape, means for directing the radiant energy beams towards the reticle thereby creating a reticle image, means for directing the reticle image along a predetermined optical path towards the substrate, means for precisely placing the reticle image on the substrate, image reduction means for reducing the reticle image to a predetermined size prior to generating the reticle image on the substrate, and scanning means for scanning said reticle in a first direction to generate a first reticle image stripe on the substrate and scanning said reticle image in a second direction to generate a second reticle image stripe on the substrate, wherein the second reticle image stripe overlaps the first reticle image stripe.

The present invention utilizes small field imaging optics and a scan based printing strategy to enable the generation of arbitrarily large fields. The use of small field imaging optics allows the use of high NA reduction lens assemblies capable of printing very small geometries. The field size in a first (scan) axis is extended by scanning a reticle defining the image of an integrated circuit pattern past a radiant energy source to generate a stripe on the photosensitive material on the substrate. The field size in a second (cross-scan) axis is extended by stitching the scans (stripes) together in an overlapped fashion. The effective field size of such a system is limited only by reticle size and reticle stage and wafer stage mechanics.

While the overlapped printing strategy averages many random and systematic errors, the present invention further minimizes printing errors caused by improper placement of the reticle image on the wafer. Such placement errors are generally due to stage synchronization errors. The present invention addresses stage synchronization errors through a steering means that places a reticle image precisely on a substrate. The steering means also reduces stage synchronization accuracy requirements enabling the use of less stringent stage designs. Finally, the printing of a scan-field may occur in multiple passes. A scan-field represents an entire reticle image that has been generated on the substrate. The multiple pass printing strategy further reduces systematic and random errors such as lens distortion, placement errors and illumination uniformity errors.

BRIEF DESCRIPTION OF THE DRAWINGS

FIG. 6 is a block diagram of a system architecture of an alternative embodiment as may be utilized by the present invention.

DETAILED DESCRIPTION OF THE PREFERRED EMBODIMENT

A method and apparatus for printing integrated circuit patterns with arbitrarily large field sizes using small field optics is disclosed. In the following description, numerous specific details are set forth to provide a thorough understanding of the present invention. It will be apparent to one skilled in the art that the invention may be employed without these specific details. In other instances, well-known methods and structures have not been set forth in order not to unnecessarily obscure the understanding of the present invention.

As the prior art has shown, it is possible to write circuit patterns with sub-micron feature sizes and to extend an image field size on one axis using scanning techniques. A primary difficulty in extending the field size in both directions lies in butting together adjacent scan fields. Adjacent scan fields must stitch together flawlessly, for the seam may lie inside a device pattern itself. The present invention minimizes butting errors through a multi-pass overlapped printing method. An overlapped printing technique is described in U.S. Pat. No. 4,879,605, Warkentin et al., entitled "Rasterization System Utilizing an Overlay of Bit-Mapped Low Address Resolution Databases", assigned to assignee of the present invention. A second known technique for printing circuit patterns using electron beams as a radiant energy source is found in U.S. Pat. No. 4,498,010, Biechler et al. entitled "Virtual Addressing for E-Beam Lithography", assigned to the ETEC Corporation of Hayward, Calif.

A second difficulty posed by all reduction scanning systems is the precise placement of a reticle image on a wafer. It should be noted that the terms substrate and wafer are used interchangeably and refer to the same object. In any event, one aspect is the synchronization of the wafer and reticle stages. For reduction scanning systems, a wafer stage and a reticle stage will be moving at different speeds. In order to minimize writing errors, stage position and velocity must be closely aligned. The present invention addresses stage synchronization through a motion control computer coupled to position control and detecting devices. Thus, one means for providing precise placement is through stringent stage synchronization requirements. This technique is known in the art.

The present invention utilizes a second technique by which precise placement may be provided. This second technique provides for repositioning a reticle image at a focal point, defined by the optical components comprising the optical system, within the optical path.

The preferred embodiment of the present invention is disclosed in disclosure document No. 271991 filed pursuant to the document disclosure program of the United States Patent and Trademark Office. An alternative embodiment of the present invention is disclosed in disclosure document No. 260461 filed pursuant to the document disclosure program of the United States Patent and Trademark Office. In both the preferred and alternative embodiments, circuit patterns defined by a reticle are printed onto a photoresist on a semiconductor wafer.

In the preferred embodiment, a trapezoidal shaped illumination beam emanating from an illumination system is created. It has been determined that the resulting trapezoidal shaped field will relax but not negate the requirement for precisely placing the image to be printed onto the wafer. However, this does negate the need for the creation of an intermediate image plane. As will be discussed, other shapes may be utilized to obtain similar results.

Architecture of the Preferred Embodiment

Figure 1:
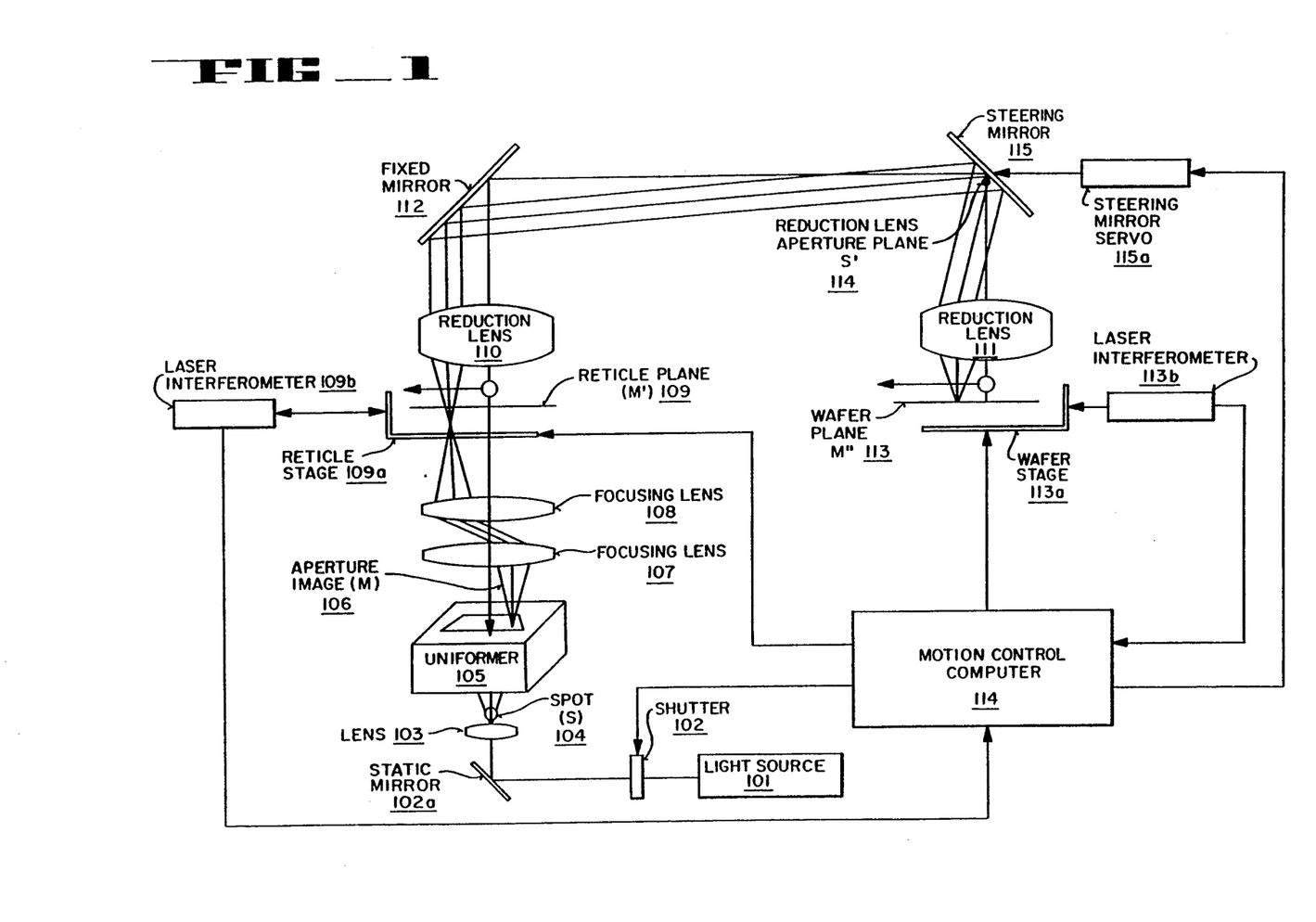
FIG. 1 is a block diagram of a system architecture of a preferred embodiment small field print scanner, as may be utilized by the present invention.

The architecture of the preferred embodiment is illustrated in FIG. 1. A radiant energy source, e.g. a continuous wave laser 101 is the source which feeds an illumination system. The laser source 101 passes through a shutter 102 and is reflected from a first static mirror 102a to a first lens 103. The static mirror 102a is placed within the optical path at a point of convenience. In this case, it is placed to bend the optical path towards other components in the illumination system. It would be apparent to one skilled in the art to utilize a radiant energy source whose beam is directed vertically so that the static mirror 102a would not be needed or to place the static mirror at a point before the reticle plane. The shutter 102 is coupled to and controlled by a motion control computer 110. The shutter 102 provides a convenient means to remove the radiant energy source and inhibit writing, for example when areas on the wafer that have been previously exposed, are being traversed. It would be apparent to one skilled in the art to place a shutter elsewhere in the optical path without departing from the spirit and scope of the present invention.

The lens 103 focuses the laser to a small spot, S 104, with a large divergence. The spot 104 is at the entrance to a Brewster's light tunnel type of uniformer 105 which may alternatively be the shape of a trapezoid or have a trapezoidal aperture. In any event, the illumination M 106, emitted from the uniformer 105 will be preferably in the shape of a trapezoid. The internal reflections of the uniformer causes uniform illumination through the aperture. The trapezoidal illumination is re-imaged with a second lens 107 and a third lens 108 through the reticle stage 109b onto the reticle plane, M' 109 where a portion of a reticle will be illuminated. At the reticle plane, the illumination M' 109 is a well corrected conjugate of the illumination aperture M 106. Well corrected is a term that refers to the absence of significant optical aberrations or distortions.

The illuminated reticle image will then traverse through a first reduction lens 110 and reflect off of a fixed mirror 112. The illuminated reticle image will then be directed towards a two axis steering mirror 115. The image will then traverse through a second reduction lens 111 and thereupon onto the wafer plane M" 113. In sum, the illuminated region of the reticle at M' 109 is re-imaged at a 4 to 1 reduction by a reduction lens assembly comprised of reduction lens 110 and reduction lens 111, onto a wafer plane M" 113 on wafer stage 113a.

It should be noted with reference to FIG. 1 that the lens elements 110 and 111 are schematic, that is they may actually represent an assembly of several lens elements. Such reduction lens assemblies are known in the art and are typically used in step and repeat systems, as described with respect to the prior art. Lenses manufactured for step and repeat cameras (by companies such as Zeiss of Oberkochen, West Germany and Tropel Division, GCA Corporation of Fairport, N.Y.) include both portion 110 and 11 in one mechanical package. The optical design would be modified to introduce more optical path between the two halves 110 and 111. Typical step and repeat camera lenses have a reduction ration of 5:1 but in some cases a 10:1 ratio is utilized.

Preferred Embodiment Printing Strategy

The preferred embodiment utilizes a scanning technique for printing circuit patterns on a wafer. A reticle is scanned through the radiant energy source, thus creating an image which is scanned onto the wafer. Typically, a reticle will define circuit patterns of several die to be printed on the wafer. Thus, a plurality of scans across the entire reticle are needed to print the entire wafer. As the image is scanned onto the wafer, a photoresist on the wafer will be exposed, thus printing the circuit pattern. In the preferred embodiment, a photoresist such as SNR 248 may be utilized. Printing will occur by overlapping stripes written across a wafer. Stripe is a term that refers to the area swept out on the wafer by the illumination aperture during one traverse by the reticle and wafer stages. The length of a stripe is typically the size of several die on the wafer. The width of a stripe corresponds to the long dimensions of the trapezoidal illumination aperture when reduced by (in the preferred embodiment by 4×). Thus, scanning of the reticle and printing on the wafer will occur in a serpentine pattern. Each portion of the wafer to be exposed will be scanned twice, by a different portion of the lens assembly. As will be described, in the preferred embodiment, the shape of the illumination aperture removes the requirement to place the illuminated region in exactly the right place on the wafer.

Figure 2A:
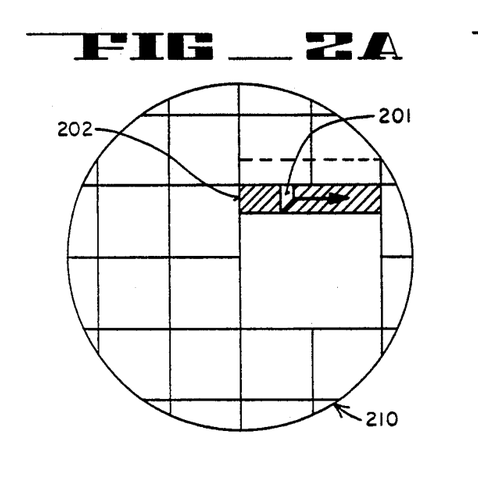
FIGS. 2a-2d are a sequence of diagrams illustrating overlapped scanned printing as may be utilized by the preferred embodiment of the present invention.
Figure 2B:
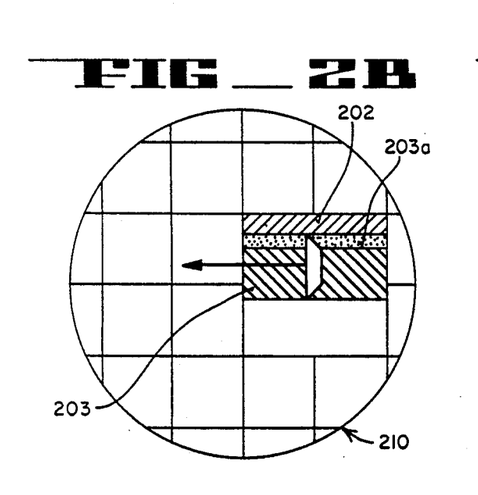
Figure 2C:
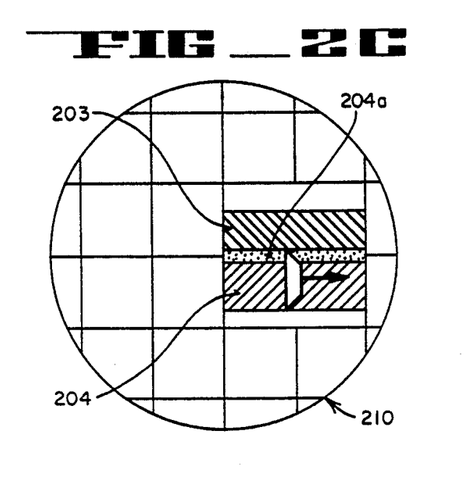
Figure 2D:
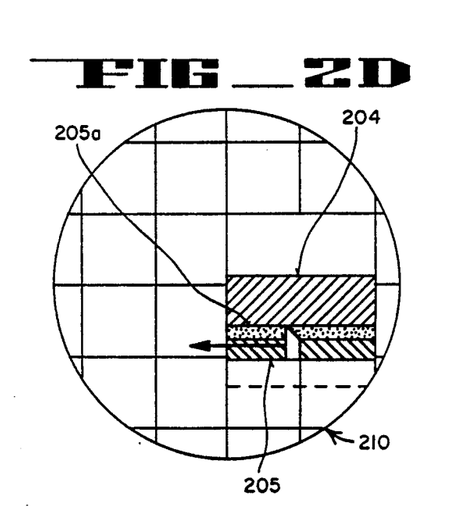

FIG. 2a-2d illustrates the printing of a scan-field in a single pass. A scan-field represents the total area swept out on the wafer by scanning the entire reticle. FIG. 2a shows a pass on the scan axis. The illumination aperture illuminates the portion of the reticle to be written to create a print image 201. As the print image 201 is scanned, a stripe 202 is printed onto wafer 210. The effects of the trapezoidal aperture are discussed below. Upon reaching the end of the stripe, the reticle and wafer stages will move in a corresponding fashion, repositioning so that the next stripe to be written is displaced in the direction perpendicular to the scan direction, know as the slit or cross-scan direction, as shown in FIG. 2b. When printing in the reverse direction, the stripe 203 will overlap onto the stripe 202 resulting in overlapped region 203a. In the preferred embodiment, the overlap will be approximately the length of the tapered sides of the trapezoidal aperture. Overlap regions will be described in greater detail below with respect to the illumination aperture shape. Upon reaching the end of the stripe 203, the reticle and wafer stages will again reposition so that the scan will be from left to right, as in FIG. 2c. Here the stripe 204 will overlap the stripe 203, resulting in overlapped area 204a. Finally, FIG. 2d shows a fourth pass from right to left, the stripe 205 overlapping the stripe 204, thus completing a scan of the entire reticle. It should be noted that an opaque frame is typically found on the reticle to define the edges of the region to be printed.

To print the next scan-field the reticle stage moves the reticle to a start position and the wafer stage moves the wafer to the beginning of the next scan-field. The steps described above are then repeated.

Alternatively, each stripe or scan-field may be exposed through multiple passes of the print image. For a stripe repeat mode, this may simply be a matter of repositioning the reticle stages to their respective beginning of stripe locations and repeating the stripe pass with a fixed scan offset to use a different portion of the illumination aperture and lens to expose the same point on the wafer. For two pass operation this offset would be one-half the length of the trapezoidal aperture. For four pass operations the offsets used would be ¼, ½, ¾ the length of the trapezoidal aperture.

Figure 2E:
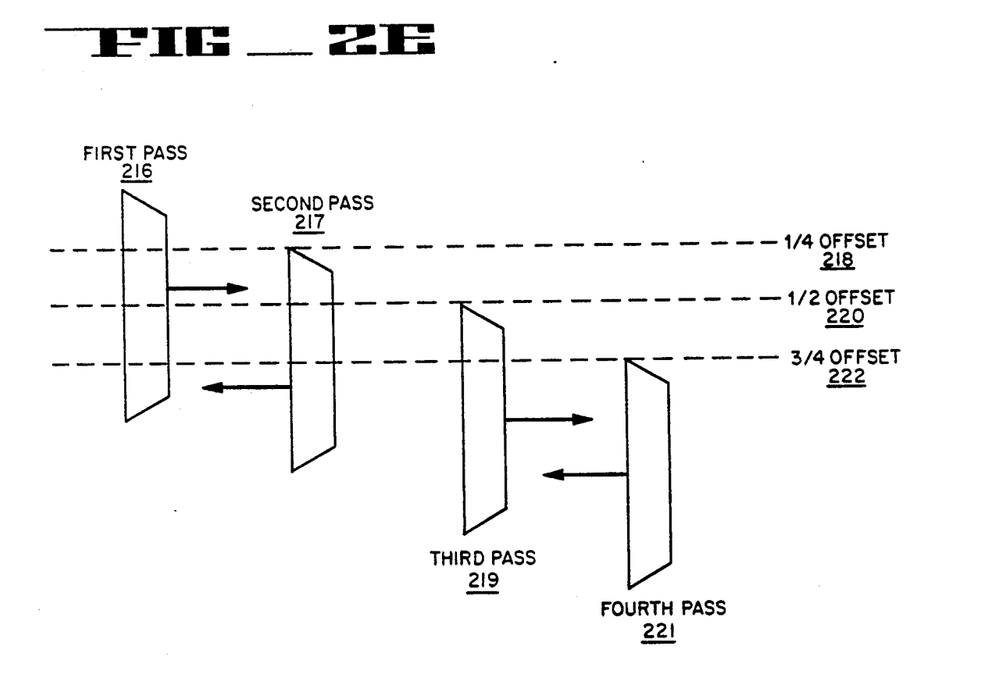
FIG. 2e illustrates multiple-pass, offset printing as may be utilized by the preferred embodiment of the present invention.

A four pass stripe printing operation is illustrated in FIG. 2e. A first pass 216 provides the basis for the offsets of subsequent passes. A second pass 217 is made with an offset 218 that is ¼ the size of the trapezoidal aperture. The second pass 217 is made in the opposite direction of the first pass 216. A third pass 219 is made that is with an offset 220 that is ½ the size of the trapezoidal aperture from the first pass 216. The third pass is in the same direction as the first pass 216. In the fourth pass 221, the offset 222 is ¾ the size of the trapezoidal aperture from the first pass 216. The fourth pass 221 is in the same direction as the second pass 217.

For a scan-field repeat mode the entire scan-field is printed and then is repeated with the appropriate offsets for the number of passes used.

The advantage of multiple passes would be to reduce residual exposure uniformity errors in the overlapped regions of a scan-field as well as uniformity errors from the illumination and lens imperfections. The disadvantage of multiple passes is that the print time is increased by a factor related to the number of passes taken.

Illumination Aperture Shape

Figure 3:
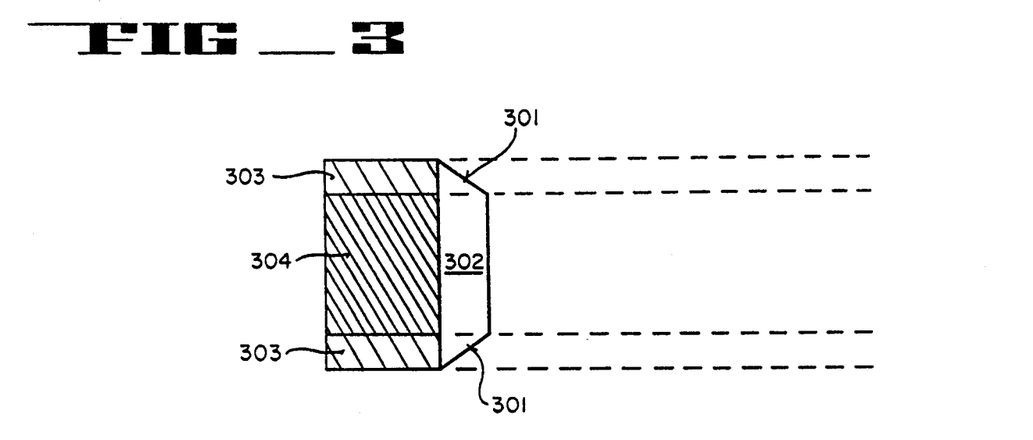
FIG. 3 illustrates a trapezoidal shaped aperture and it's effect upon a scan field of a wafer.

As described above, the illumination aperture and resulting field image are of a trapezoidal shape. An inherent result of the aperture shape is that the portions of the wafer exposed to the tapered ends are not exposed to as much of the radiant energy source during a scan, as the rectangular middle portion. Such a trapezoidal aperture image and resulting stripe is illustrated in FIG. 3. Comparing tapered ends 301 with rectangular area 302, as the aperture moves across a wafer, the wafer areas 303 corresponding to tapered ends 301 will be exposed to the radiant energy source for a shorter duration than will the wafer areas 304 (corresponding to rectangular area 303).

Figure 4:
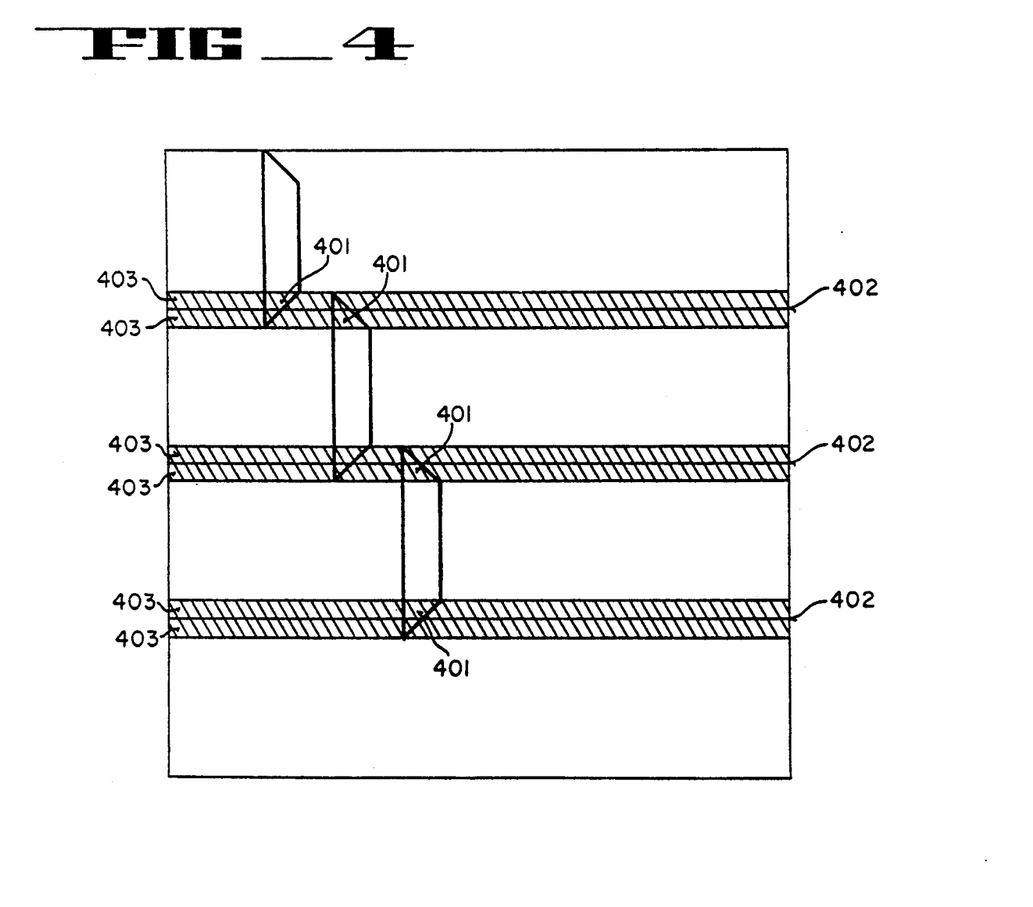
FIG. 4 illustrates butt joints and feathered areas resulting from a printing strategy as utilized by the preferred embodiment of the present invention.

FIG. 4 illustrates a scan field. While scanning to produce the image stripes, the tapered ends 401 are overlapped to "feather" the scan butt joints 402. "Feather" in this context means to blend adjacent images together so that the boundary is indistinguishable from the interior. This creates feathered areas 403. The overlap in the preferred embodiment is approximately the length of a tapered side. As described above with reference to FIG. 3, the dosage of the radiant energy source in the portions of the wafer covered by rectangular areas (e.g. area 302 in FIG. 3) will be of the desired dosage and the dosage received at the tapered ends will be less than the desired dosage. In the cross scan axis, the tapered portion of the trapezoidal slits are overlapped on subsequent passes and has the effect of averaging the dose non-uniformity over the entire tapered overlapped region. This effect is further illustrated in FIG. 5.

Figure 5:
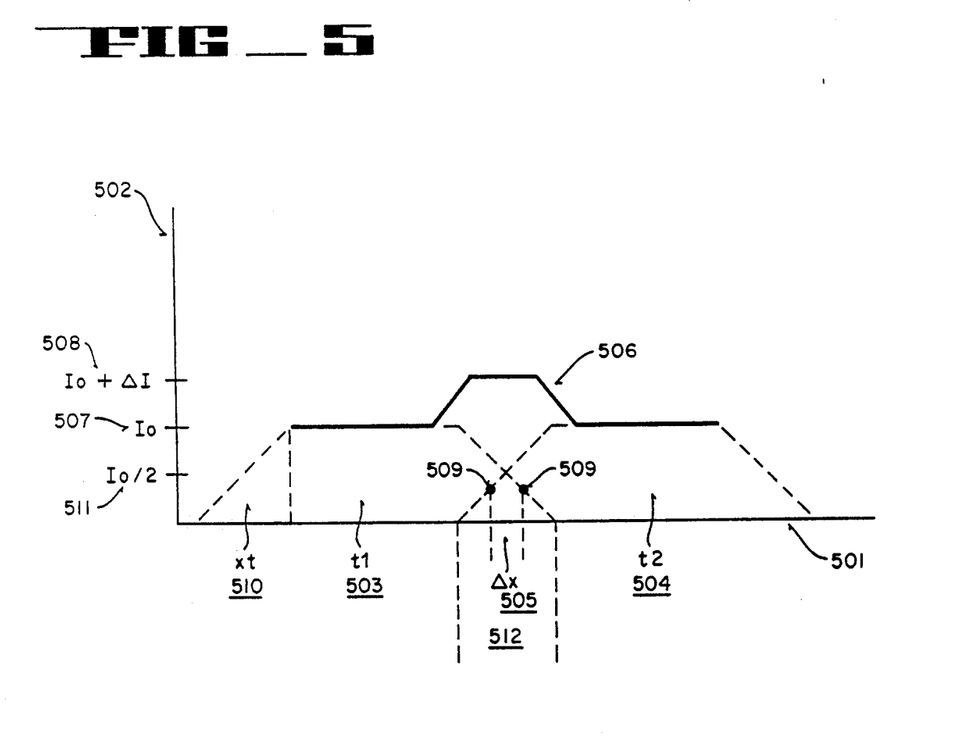
FIG. 5 is a chart illustrating the effect on dosage when using the printing strategy of the present invention.

FIG. 5 illustrates the effect the trapezoidal aperture and feathering has on the dosage presented to an area on a wafer. The horizontal axis 501 represents various positions on the wafer. The vertical axis 502 represents the dosage on a particular area on the wafer. Along the horizontal axis a first trapezoid t1 503 and a second trapezoid t2 504 are illustrated. The length of the tapered region is denoted by $\Delta t$ 510. The center points 509 of the overlapped tapered regions are separated by a distance $\Delta x$ 505 and occur at dosage levels Io/2 511. The midpoint separation $\Delta x$ 505 represents a butting error in the placement of the adjacent stripes. Illustrated atop the trapezoids t1 503 and t2 504 is an exposure measure line 506. The exposure measure line 506 indicates the amount of exposure incurred at each portion of the wafer.

At the point on the vertical axis labeled Io 507, the desired amount of dosage has been applied. This corresponds to the rectangular areas of the trapezoids t1 503 and t2 504. Within the overlap area 512, the amount of dosage increases a maximum amount of $\Delta I$. The maximum amount of dosage occurs in the area 512, where there is an overlap. This results in a dosage amount of Io+$\Delta I$ 508. However, as noted above the dosage error is averaged over the entire tapered regions of the overlapped stripes. Thus, a 1 micron butting error causing a 1 micron strip of 200% exposure might be averaged to an error of ~0.1% over a 1 mm strip. It should be noted that the relation between butting error and dosage error is given by the equation $\Delta I/Io = \Delta x/xt$. $\Delta I$ and $\Delta x$ may be either positive or negative.

Although a trapezoid shape is used in the preferred embodiment, a trapezoid is not the only shape that will provide the error correcting effect. It would be apparent to one skilled in the art to use an aperture or field of a differing shape, e.g. in the shape of a parallelogram or one with stair-stepped shaped ends. If such alternative shapes are utilized, the overlap would correspondingly change. Utilizing such different shapes would not depart from the spirit and scope of the present invention.

The effect described with respect to FIG. 5 may also be obtained by using an illumination means which provides for linear intensity gradients, i.e. varying intensities across an aperture. This may be in the form of a gradient mask across the illumination aperture, or may be a character of the radiant energy source itself. Use of such an illumination means would not depart from the spirit and scope of the present invention.

It has been observed that in the scan direction, dosage errors from errors in stage velocity are averaged over the trapezoidal slit width. It has been further been observed that small errors in positioning of the trapezoidal illuminated region on the wafer (or mask) show up as small percentage errors in deposited dosages of light. It is because of this error averaging, the illumination aperture may be fixed within the illumination system.

Illumination System

As described above with reference to FIG. 1, the illumination system is primarily comprised of a radiant energy source 101, a first focusing lens 103, a uniformer defining a trapezoidal shaped aperture 105, a second focusing lens 107, and a third focusing lens 108. The radiant energy source for the system in the preferred embodiment is an arc lamp or laser. These sources provide the necessary power and accuracy characteristics needed to print the desired circuit patterns. It has been determined that a short wavelength source is required for printing circuit patterns with 0.25 micron features. It has been discovered that a suitable optical glass to enable this is fused silica. This allows little color correction within the design and a very narrow bandwidth source for example, a laser is required. In the preferred embodiment, a continuous wave laser source may be utilized, i.e. a frequency doubled Argon ion laser operating at 257 or 244 nm wavelength or a Krypton ion laser operating at a 242 nm wavelength. Over 500 mW have been observed experimentally from Krypton ion laser at 242 nm at short times. Systems that may be used with each of these radiant energy sources is discussed below with reference to specific design examples. Alternatively, an excimer laser operating at 248 nm or 193 nm could be used by synchronizing the flashes so that an integral number of flashes occur across the illumination aperture. The repetition rate would preferably be fast enough to average out intensity variations in power between flashes.

The first focusing lens 103 creates the radiant energy source for the illuminator 105. The first focusing lens 103 will create an illumination with a wide dispersion. Such lenses are well known in the field of art and are described in publications such as "Optical Lithographic Tools: Current Status and Future Potential" Janusz S. Wilczynski Journal of Vacuum Science Technology B5(1) 1987. Although not illustrated in FIG. 1, an additional diffusing element may be placed at the focus of lens 103 to further disperse the light and reduce its coherence.

As described above, the printing strategy and aperture shape do not require that the illuminated region be in exactly the right place on the wafer. Further, as will be described below, the reticle and wafer stages are controlled to several microns. Because of the error averaging discussed above, no servo control of the illumination aperture is required in the cross scan direction. Since the illumination aperture is sufficiently large (ca. 1 mm), no servo control is necessary in the scan direction. This allows the illumination aperture to be fixed and defined in the illumination system and re-imaged at the wafer (mask) plane.

It should be noted that the illumination aperture may be placed outside of the illumination system. Such an illumination aperture placement is illustrated in an alternative embodiment described below.

In the preferred embodiment a Brewster's Light Tunnel type of uniformer is utilized. In any event, internal reflections within the uniformer 105 act to create a uniform illumination of the trapezoidal shaped aperture. The trapezoidal shaped illumination is re-imaged by the second and third lens 107 and 108 respectively, into a well corrected conjugate of the trapezoidal illumination. The second lens 107 and third lens 108 are known in the art and would have characteristics related to the distance between the uniformer 105 and the reticle plane (M') 109.

It should be noted that it would be apparent to one skilled in the art to utilize the architecture described above with alternative radiant or particle energy sources, e.g. electron beams or soft x-rays. Usage of such alternative radiant or particle energy sources would not depart from the spirit and scope of the present invention.

Preferred Embodiment Stage Synchronization

The architecture of the preferred embodiment provides for a reticle stage 109b and a wafer stage 113a. The stages must provide for movement along an X-Y plane at a precise velocity. Such stages that may be utilized are similar as to that described in U.S. Pat. No. 4,758,091, entitled "Pattern Generator Part Holder", assigned to the assignee of the present invention. As described above, it is the reticle and the wafer which are the components in motion. As the reticle image is undergoing a 4 to 1 reduction as it is being written to the wafer, the movement of the wafer stage will be in smaller increments than that of the reticle stage. It has been determined that the position of the wafer relative to the image of the reticle must be accurate to approximately one tenth the minimum feature size while both stages are in motion. For example, with 0.25 micron geometries, the accuracy must be within 25 nanometers or 0.025 microns. However, in the preferred embodiment such stringent wafer synchronization requirements are relaxed, by the use of the steering mirror. The steering mirror is described in more detail below.

Referring to FIG. 1, a first laser interferometer 109b and a second laser interferometer 113b provide position information of the reticle stage 109a and the wafer stage 113a, respectively, to the motion control computer 114. The motion control computer 114 is further coupled to reticle stage 109a and wafer stage 113a. The reticle stage 109a and the wafer stage 113a include a servo mechanism to control movement of the respective stage. When the motion control computer 114 detects a synchronization problem, corrective commands will be sent to servo mechanisms (not illustrated) of the reticle stage 109a and wafer stage 113a.

Steering Mirror

Still referring to FIG. 1, in the preferred embodiment, the motion control computer 114 provides correction information to the steering mirror 115. This correction information may generally be derived from data delivered from the first laser interferometer 109b and second laser interferometer 113a. The motion control computer 115 would in turn determine the best means for determining how to properly place the reticle image on the wafer. In the preferred embodiment, the steering mirror is used to make corrections at a first predetermined error threshold, e.g. less than 1 micron, while the servos coupled to the wafer and reticle stages make error corrections at greater than 1 micron levels.

The steering mirror 115 is coupled to a servo mechanism 115a which controls it's rotation about two orthogonal axes parallel to the reflective surface. The two axis steering mirror 115 is located at the lens aperture plane S' 114. As described above, the steering mirror 115 moves the image of the illuminated portion of the reticle to the correct location on a wafer, compensating for errors in stage location. The steering mirror 115 places the "data" onto a precise location on the wafer. In other words, the action of the steering mirror serves to place the geometries on the reticle in the correct location on the wafer. The use of the trapezoidal illumination aperture of finite (approximately 1 millimeter) width reduces dosage uniformity errors in exposing these geometries on the wafer.

Heretofore a steering mirror has not been used to address placement errors. The emphasis on correcting placement errors has focused on stage synchronization. A reason may be the fact that high performance optical systems are typically packaged so that any proper aperture plane in which corrections may be made, is inaccessible. Furthermore, existing lithography tools have developed from either 1× scanners where stage errors are unimportant or from step and repeat cameras where the stage is driven to a known fixed location for each exposure.

In the preferred embodiment, the steering mirror 115 may be piezoelectrically or electromagnetically actuated. Such a steering mirror 115 is described in U.S. Pat. No. 4,778,233, entitled "Steering Mirror", assigned to the assignee of the present application.

Design Examples Of the Preferred Embodiment

The performance specifications of the preferred embodiment of the present invention may be changed by using alternative component parts. Table 1 provides a comparison of a System 1 and a System 2. System 1 is capable of printing 0.24 micron features with a throughput of 40 wafers per hour. Table 1 gives the key parameters and the relationship between them for such a machine in the System 1 column. System 2 is a more conservative design, also capable of printing 0.24 micron features, but with a throughput of 20 wafers per hour. System 2 utilizes a lens with a smaller field width and incorporates a less powerful laser. These two factors result in requiring a reduced stage velocity for System 2. Both System 1 and System 2 are based on the architecture of the preferred embodiment.

Referring to Table 1, System 1 uses a frequency doubled Argon ion laser source with a WAVELENGTH at 244 nm and LASER POWER of 533 mW. The REDUCTION LENS NA chosen is 0.8. This will enable the RESOLUTION needed for printing the 0.24 micron sized features. The REDUCTION RATIO is 4 to 1. The LENS FIELD WIDTH is 10 mm, large for a 0.8 NA lens but significantly smaller than the 20 to 30 mm field sized typically found on a microlithographic reduction lens. It has been determined that design complexity increases non-linearly with increasing field size, so the large NA should be manageable. The characteristics of the reduction lens is consistent with commercially available and commercially viable products. The SCAN FIELD LENGTH and WIDTH are chosen to be 40 mm so that the 4× reticle image extent of 160 mm would lie comfortably within a 7" square reticle. Improvements to throughput can be made by extending the scan field length and using non-standard reticle sizes such as a 6" by 9" format.

The key design parameters to minimize writing time are the STAGE VELOCITY, TURNAROUND TIME and LOAD AND ALIGN TIMES. The values for these parameters were chosen with relation to known stage/part holder technology. Note that a 16 cm/sec wafer STAGE VELOCITY requires a 64 cm/sec RETICLE STAGE VELOCITY.

The NUMBER OF PASSES is the number of times a point on the image is scanned with some portion of the lens field. Two is the minimum number required for some butting and lens field averaging to take place. The REQUIRED DOSE is chosen to be 20 mJ/cm$^2$ on the basis of the high photospeed of the chemically amplified deep UV resists. A total OPTICAL TRANSMISSION number is chosen to be 30% which is attainable with good optical coatings and an efficient illuminator design. The NUMBER OF SCANFIELDS/WAFER is the number of times the reticle is imaged on an 8 inch wafer and will be determined by quantity and shape of the die on the reticle. 20 was chosen because the area covered in that many fields is the same area as for an 8 inch wafer.

The system described as System 2 is based on somewhat more conservative assumptions. The two major changes are: the smaller LENS FIELD WIDTH, 6 mm instead of 10 mm, and the reduced LASER POWER, 200 mW instead of 533 mW. The extent of the SCAN FIELD WIDTH has been reduced to 36 mm to provide for an integral number of lens fields per scan field width. These changes enable a less stringent design of the lens system and radiant energy source. The wafer STAGE VELOCITY and RETICLE STAGE VELOCITY have also been reduced by 38% as well. As a consequence of the easier design goals, the system throughput falls in half to 20 wafers/hr.

TABLE 1

| PARAMETER | SYSTEM 1 | SYSTEM 2 |
|---|---|---|
| WAVELENGTH (nm), lam | 244.00 | 244.00 |
| REDUCTION LENS NA, na | 0.80 | 0.80 |
| REDUCTION RATIO, r | 4.00 | 4.00 |
| LENS FIELD WIDTH (mm), lf | 10.00 | 6.00 |
| SCAN FIELD LENGTH (mm), ss | 40.00 | 40.00 |
| SCAN FIELD WIDTH (mm), sw | 40.00 | 36.00 |
| LOAD AND ALIGN TIME (sec), lat | 14.00 | 15.00 |
| STAGE VELOCITY (cm/sec), sv | 16.00 | 10.00 |
| TURNAROUND TIME (sec), tt | 0.20 | 0.20 |
| NUMBER OF PASSES, np | 2.00 | 2.00 |
| REQUIRED DOSE (mJ/cm2), d | 20.00 | 20.00 |
| OPTICAL TRANSMISSION, ot | 0.30 | 0.30 |
| NUMBER OF SCANDFIELDS/ WAFER, ns | 20.00 | 22.00 |
| RESOLUTION (microns), res res = 8*lam/(na*1000) | 0.24 | 0.24 |
| WAFER THROUGHPUT (8" wafers/ hr), wph wph = 3600/(.01*ns*sw/sr + lat) | 40.00 | 20.00 |
| LASER POWER (mW), p p = pr*d/ot | 533.00 | 200.00 |
| RETICLE STAGE VELOCITY (cm/sec), vr vr = vs*r | 64.00 | 40.00 |

Alternative Embodiment

The alternative embodiment utilizes a rectangular shaped scan field and a steering aperture. Although a rectangular shaped scan field is described, it would be apparent to one skilled in the art to utilize a trapezoidal shaped scan field and overlapping the scans (in a manner such as that described above with respect to the preferred embodiment). The steering aperture is positioned at a first focal plane of the system, which in this instance is positioned directly proceeding a radiant energy uniformer, but in fact may be positioned at any focal plane within the system. The steering aperture is used to ensure that the proper reticle image is being presented to the system. This is in contrast to the steering mirror, which is used to provide precise placement of the reticle image onto the wafer. The multi-pass, overlapped printing technique as utilized by the preferred embodiment is also utilized in the alternative embodiment.

Architecture of the Alternative Embodiment

The architecture of the alternative embodiment is illustrated in FIG. 6. It should be noted that this embodiment is similar to the preferred embodiment. In any event, a radiant energy source, e.g. a continuous wave laser 601 is the source which feeds an illumination system. The laser source 601 passes through a shutter 602 and is reflected from a first static mirror 602a to a first lens 603. The static mirror 602a is placed within the optical path at a point of convenience. In this case, it is placed to bend the optical path towards other components within the illumination system. It would be apparent to one skilled in the art to utilize a radiant energy source whose beam is directed vertically so that the static mirror 602a would not be needed or to place the static mirror at a point before the reticle plane. The shutter 602 is coupled to and controlled by a motion control computer 610. The shutter 602 provides a convenient means to remove the radiant energy source and inhibit writing, for example when areas on the wafer that have been previously exposed, are being traversed. It would be apparent to one skilled in the art to place a shutter elsewhere in the optical path without departing from the spirit and scope of the present invention.

The lens 603 focuses the laser to a small spot, S 604, with a large divergence. The spot 604 is at the entrance to a Brewster's light tunnel type of uniformer 605. The internal reflections of the uniformer causes uniform illumination through the aperture. Positioned at a focal plane past the uniformer 605 is a steering aperture 616 which defines a rectangular shaped aperture. In the preferred embodiment, the width of the rectangular shaped aperture is 2 mm. Coupled to the steering aperture 616 is a steering servo 616a, which in turn is further coupled to the motion control computer 610. The steering aperture is used to insure that the proper reticle image is being presented to the printing system.

The rectangular shaped illumination image 606 emanating from the steering aperture 616 is re-imaged with a second lens 607 and a third lens 608 through the reticle stage 609b onto the reticle plane, M' 609 where a portion of a reticle will be illuminated. At the reticle plane, the illumination M' 609 is a well corrected conjugate of the illumination aperture M 606. Well corrected is a term that refers to the absence of significant optical aberrations or distortions.

The illuminated reticle image will then traverse through a first reduction lens 610 and reflect off of a fixed mirror 612. The illuminated reticle image will then be directed towards a two axis steering mirror 615. The image will then traverse through a second reduction lens 611 and thereupon onto the wafer plane M" 613. In sum, the illuminated region of the reticle at M' 609 is re-imaged at a 4 to 1 reduction by a reduction lens assembly comprised of reduction lens 610 and reduction lens 611, onto a wafer plane M"613 on wafer stage 613a.

It should be noted with reference to FIG. 6 that the lens elements 610 and 611 are schematic, that is they may actually represent an assembly of several lens elements. Such reduction lens assemblies and were described with respect to the preferred embodiment.

As in the preferred embodiment, the reduction lens assemblies 610 and 611 provide a 4 to 1 reduction. In both the preferred and alternative embodiments, alternative reduction ratios (and accompanying lenses) could be utilized without departing from the spirit and scope of the present invention. In any event, an image of the reticle at wafer plane 613 formed by the reduction lens assembly 610 and 611 is a mirror image of the reticle at reticle plane 609. It should be noted that if an image with the same symmetry is required, the steering mirror 604 could be replaced with two mirrors acting to deviate the rays at right angles in the manner of a pentaprism.

It should be noted that it would be apparent to one skilled in the art to utilize the architecture described above with alternative radiant or particle energy sources, e.g. electron beams or soft x-rays. Usage of such alternative radiant or particle energy sources would not depart from the spirit and scope of the present invention.

Printing Strategy

Both the preferred and the alternative embodiments utilize the same overlapping printing strategy. The primary difference is in the shape of the aperture and the action of the steering aperture. However, a trapezoidal shaped aperture could be used in the alternative embodiment to further reduce butting errors as described with respect to the preferred embodiment. The image of the reticle 609 is transferred to the wafer 613 a field at a time. In the alternative embodiment the dimensions of a print image is 2 mm×10 mm. The reticle stage 609a and the wafer stage 613a are scanned in a serpentine pattern.

Figure 7A:
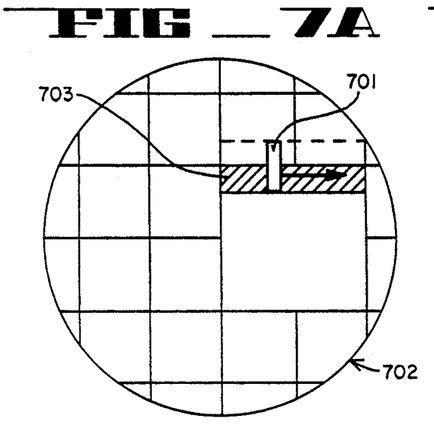
FIGS. 7a-7e are a sequence of diagrams illustrating overlapped scanned printing as may be utilized by the alternative embodiment of the present invention.

FIGS. 7a-7e illustrate the printing of a scan-field. FIG. 7a illustrates the printing of a first stripe. In FIG. 7a print image 701 traverses horizontally (in a scan direction) across a wafer 702, causing half-stripe 703 to become exposed (i.e. printed) on the semiconductor wafer. A half-stripe is printed on the top and bottom of the scan-field in order to insure uniform exposure across the scan-field. A scan involves simultaneous movement of the reticle stage 609a and wafer stage 613a. The ratio of reticle stage 609a velocity to the wafer stage 613a velocity is the same as the reduction lens assembly 610 and 611 reduction ratio, i.e. 4 to 1. The optics remain relatively stationary (e.g. except for corrections made by the steering mirror 615). Movement of the reticle stage causes the image presented to the wafer plane to change. At the completion of the printing of a stripe, the reticle and wafer stages are repositioned for printing of a next stripe. It should be noted that the reticle will typically have an opaque, border, thus preventing exposure of the neighboring scan-fields.

Figure 7B:
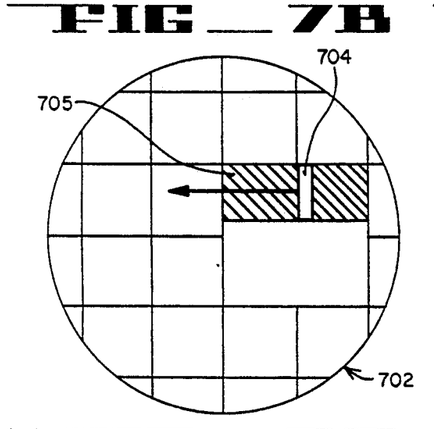

FIG. 7b illustrates scanning of a second stripe. The reticle and wafer stages are positioned so that the print image overlaps the stripe 703 by ½ the length of the aperture. This is similar to the stripe repeat mode described in the preferred embodiment where printing of an image is done in two passes. The stripe 704 is being traversed by print image 705. The motion of the reticle stage and the wafer stage then proceed in the cross-scan direction.

Figure 7C:
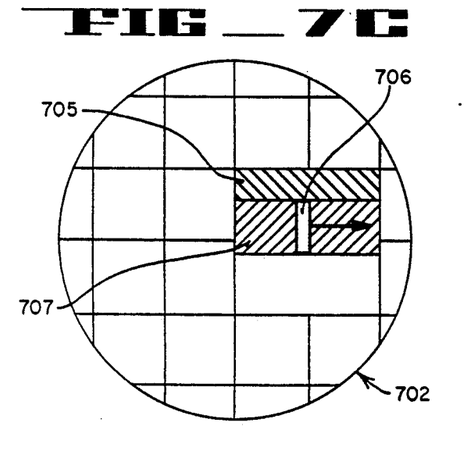
Figure 7D:
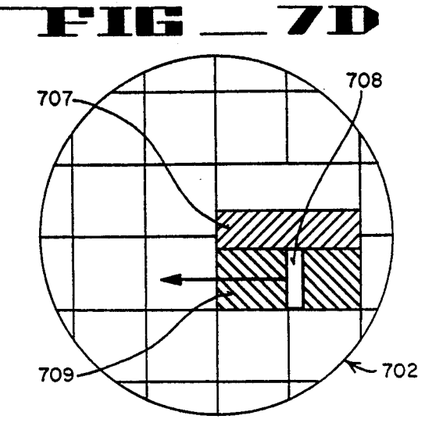
Figure 7E:
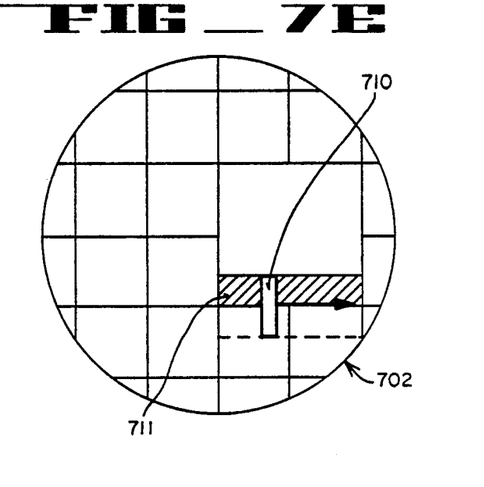

FIGS. 7c–7e illustrates the scanning of stripes 707, 709 and half stripe 711 by print images 706, 708 and 710 respectively, in the overlapped manner described above. Upon completion of the scan as in FIG. 7e, a scan-field will have been printed. At some point (not illustrated), the bottom of the wafer will be reached. When this occurs, the reticle and wafer stages will be positioned so that the next scan-field is printed. This process continues until the entire wafer is printed.

As in the preferred embodiment, each point of the image is scanned twice with a different part of the illumination aperture and lens system. However, any integral number of scans could be used without departing from the spirit and scope of the present invention. It has been observed that overlapping scans in this manner causes adjacent field joining errors to be averaged with scans having adjacent fields joined in other locations. It has also been observed that random and systematic errors associated with lens field position, such as lens distortion and illumination uniformity, are averaged over the number of scans. For an even partitioning of the lens field the radial portion of the lens distortion is nearly canceled. Random errors in stage position are also averaged. Additionally, the multiple scan printing aids in reducing illumination non-uniformity. The error averaging techniques described above have been successfully utilized in known scanned laser printing systems, such as the CORE 2500 available from the ATEQ Corporation of Beaverton, Oreg. However, the Applicant is unaware of it's use in direct wafer printing systems.

Alternative Embodiment Stage Synchronization

The architecture of the alternative embodiment provides for a reticle stage and a wafer stage. Stage synchronization occurs in a manner similar to that as described with respect to the preferred embodiment. However, errors in synchronization may also be corrected within error correction loops described below.

Referring to FIG. 6, the position of the reticle stage 609a is measured with a first laser interferometer 609b and the position of the wafer stage 613a is measured with a second laser interferometer 613b. The first laser interferometer 609b and the second laser interferometer 613b are coupled to the motion control computer 610. The information from the first interferometer 609b and second interferometer 613b is used to control stage velocity and synchronization, and to provide error signals to a first error correction loop and a second error correction loop, which are described in more detail below. The motion control computer provides the signals to the reticle stage 609a and the wafer stage 613a for keeping them in proper synchronization.

A problem that is similar to synchronization is that of alignment of the reticle 609 and the wafer 613. Alignment of the reticle 609 to the wafer 613 can be accomplished by detecting a wafer mark(s) defined within the reticle 609 and aligning the wafer 613 to this mark. Detection may occur through the mirror 612 as the image is being printed. The motion control computer may then cause any necessary positional corrections.

Error Correction Loops

The synchronization of the reticle stage 609a and the wafer stage 613a at different speeds to tens of nanometers is a difficult problem. Error correction loops defined within the motion control computer 612 in the alternative embodiment, render the problem tractable. The purpose of the error correction loops is to compensate for errors in synchronization and to place the image of the rectangular aperture defined by the steering aperture 616 at the correct location on the wafer 613 at any instant and furthermore to place the correct image "data" within the aperture.

A first error correction loop is comprised of the steering aperture 616 and the first laser interferometer 609b. The first error correction loop only requires position information about the reticle stage 609a. The first error correction loop is used to insure the correct portion of the reticle image is presented to the printing system. This ensures that the correct image "data" is selected from the reticle. The steering aperture 616 is coupled to a steering aperture servo 616a which may be piezoelectrically or electromagnetically actuated. The movement of the steering aperture 616 causes a corresponding movement of the illumination aperture image 606, to the printing system.

A second error correction loop is used to precisely place the reticle image onto the wafer. The second error correction loop is comprised of the steering mirror 615, the first laser interferometer 609b and the second laser interferometer 613b. The steering mirror 615 places the "data" onto a precise location on the wafer. The second error correction loop requires position information about the reticle stage 609a and the wafer stage 613a. The steering mirror 615 is coupled to steering mirror servo 615a which may be piezoelectrically or alternatively electromagnetically actuated. Such a steering mirror 615 is described in U.S. Pat. No. 4,778,233, entitled "Steering Mirror", assigned to the assignee of the present application. When the steering mirror is moved, the position of the reticle image at wafer plane 613 changes.

With these two error correction loops present, stage synchronization position accuracies can be relaxed from tens of nanometers to perhaps several microns. The action of the two error correction loops also ensures that there is uniform exposure across the scan-field with no butt joint gaps or overlays.

Alternative Embodiment Illumination Source

As described above, the radiant energy source for the system in the alternative embodiment could be an arc lamp or laser. As discussed above with respect to the preferred embodiment, for the short wavelengths required for printing 0.25 microns it has be discovered that one suitable optical glass is fused silica. The radiant energy source in the alternative embodiment would be the same as would be utilized in the preferred embodiment.

Design Examples of the Alternative Embodiment

As with the preferred embodiment, the performance specifications of the alternative embodiment may be changed by using different component parts. Table 2 provides a comparison of a System 3 and a System 4, both of which would utilize the architecture of the alternative embodiment. System 3 and System 4 correspond to the System 1 and System 2 described above with respect to the preferred embodiment. System 3 is capable of printing 0.25 micron features with a throughput of 40 wafers per hour. Table 2 gives the key parameters and the relationship between them for such a machine in the System 3 column. Shown under the System 4 column are parameters for a machine with a throughput of 20 wafers per hour. System 4 is a more conservative design with a 0.6 lens field size and a longer wavelength source.

Referring to Table 2, System 3 uses a direct Krypton ion laser line at 242 nm. Over 500 mW have been observed experimentally at this line for short times. The LENS FIELD WIDTH is 10 mm, large for a 0.8 NA lens but significantly smaller than the 20 to 30 mm field sized typically found on a microlithographic reduction lens. It has been determined that design complexity increases non-linearly with increasing field size, so the large NA should be a tractable design problem. The LENS SLIT WIDTH is the small dimension of the steering aperture as imaged on the wafer. It determines the amount of image averaging in the direction of scan and affects aspects of the illuminator design. It has no effect on the other system parameters. The SCAN FIELD LENGTH and WIDTH are chosen to be 40 mm so that the 4× reticle image extent of 160 mm would lie comfortably within a 7" square reticle. Improvements to throughput can be made by extending the scan field length and using non-standard reticle sizes such as a 6" by 9" format. The key design parameters to minimize writing time are the STAGE VELOCITY, TURNAROUND TIME and LOAD AND ALIGN TIMES. Note that a 16 cm/sec wafer STAGE VELOCITY requires a 64 cm/sec RETICLE STAGE VELOCITY. The NUMBER OF PASSES is the number of times a point on the image is scanned with some portion of the lens field. Two is the minimum number required for some butting and lens field averaging to take place. The REQUIRED DOSE is chosen to be 20 mJ/cm² on the basis of the high photospeed of the chemically amplified deep UV resists. A total OPTICAL TRANSMISSION number is chosen to be 30% which should be attainable with good optical coatings and an efficient illuminator design. The NUMBER OF SCANFIELDS/WAFER is the number of times the reticle is imaged on an 8 inch wafer and will be determined by quantity and shape of the die on the reticle. 20 was chosen because the area covered in that many fields is the same area as for a 8 inch wafer.

System 3 has a conservative RESOLUTION of 0.24 microns based on a k factor of 0.8 (R=λ/NA). The PEAK THROUGHPUT which does not have turnaround time or load and align time overhead included is 8 cm²/sec. This is reduced to less than half this number by the overhead terms. The final WAFER THROUGHPUT is 40 wafers/hr. The LASER POWER required for this throughput is 533 m W close to the number that has been demonstrated with experimental lasers.

The system described as System 4 is based on somewhat more conservative assumptions. The two major changes are: the smaller field size of the lens, 6 mm instead of 10 mm, and the reduced laser power, 200 m W instead of 533 m W. The wavelength has been changed to 257 nm which is the frequency doubled 514 nm Ar ion line on the basis of a commercial product in existence today (e.g. the Spectra-Physics Model 395B available from the Spectra-Physics Corporation of Mountain View, Calif.). The extent of the SCAN FIELD WIDTH has been reduced to 36 mm to provide for an integral number of lens fields per scan field width. These changes reduce the difficulty in the design of the lens system and radiant energy source. The wafer STAGE VELOCITY and RETICLE STAGE VELOCITY have also been reduced by 38% as well. As a consequence of the easier design goals, the system throughput falls in half to 20 wafers/hr.

TABLE 2

| PARAMETER | System Parameters | |
|---|---|---|
| | SYSTEM 3 | SYSTEM 4 |
| WAVELENGTH (nm), lam | 242.00 | 257.00 |
| REDUCTION LENS NA, na | 0.80 | 0.80 |
| REDUCTION RATIO, r | 4.00 | 4.00 |

TABLE 2-continued

| PARAMETER | System Parameters | |
|---|---|---|
| | SYSTEM 3 | SYSTEM 4 |
| LENS FIELD WIDTH (mm), lf | 10.00 | 6.00 |
| LENS SLIT WIDTH (mm), ls | 2.00 | 2.00 |
| SCAN FIELD LENGTH (mm), ss | 40.00 | 40.00 |
| SCAN FIELD WIDTH (mm), sw | 40.00 | 36.00 |
| LOAD AND ALIGN TIME (sec), lat | 14.00 | 15.00 |
| STAGE VELOCITY (cm/sec), sv | 16.00 | 10.00 |
| TURNAROUND TIME (sec), tt | 0.20 | 0.20 |
| NUMBER OF PASSES, np | 2.00 | 2.00 |
| REQUIRED DOSE (mJ/cm2), d | 20.00 | 20.00 |
| OPTICAL TRANSMISSION, ot | 0.30 | 0.30 |
| NUMBER OF SCANDFIELDS/WAFER, ns | 20.00 | 22.00 |
| RESOLUTION (microns), res<br>res = 8*lam/(na*1000) | 0.24 | 0.26 |
| PEAK THROUGHPUT (cm2/sec), pr<br>pr = .1*lf*sv/np | 8.00 | 3.00 |
| SCAN FIELD PASSES, sp<br>sp = np*(sw/lf) + np − 1 | 9.00 | 13.00 |
| SCAN FIELD THROUGHPUT (cm2/sec), sr<br>sr = 1/((1/pr) + (100*sp*tt/(ss*sw))) | 4.21 | 1.95 |
| WAFER THROUGHPUT (cm2/sec), wr<br>wr = 1/((1/sr) + 100*lat/(ns*ss*sw)) | 3.56 | 1.78 |
| WAFER THROUGHPUT (wafers/hr), wph<br>wph = 3600/(.01*ns*sw/sr + lat) | 40.00 | 20.25 |
| LASER POWER (mW), p<br>p = pr*d/ot | 533.00 | 200.00 |
| RETICLE STAGE VELOCITY (cm/sec), vr<br>vr = vs*r | 64.00 | 40.00 |

Thus, a small field scanner device is disclosed. Utilizing refractive optics to reduce a reticle image, scanning the reticle image onto a wafer in an overlapping pattern, integrated circuit patterns with features sizes of less than 1 micron may be printed.

I claim:

1. In the photolithographic manufacture of integrated circuits, wherein a circuit pattern defined by a reticle is written on a semiconductor wafer, said reticle positioned on a reticle stage and said wafer positioned on a wafer stage, a method of printing said circuit pattern comprising the steps of:
   a. positioning said reticle stage at a first predetermined position;
   b. positioning said wafer stage at a second predetermined position;
   c. precisely placing a reticle image on said wafer;
   d. scanning a first print image field of said reticle in a first direction,
   e. simultaneous with step d., scanning said wafer causing a first stripe to be printed on said wafer;
   f. positioning said reticle stage at a third predetermined position for scanning a second print image field;
   g. positioning said wafer stage at a fourth predetermined position;
   h. precisely placing a reticle image on said wafer;
   i. scanning said second print image field of said reticle in a second direction; and
   j. simultaneous with step i., scanning said wafer causing a second stripe to be printed on said wafer, said second stripe overlapping said first stripe.

2. The method as recited in claim 1 wherein said second direction is opposite said first direction and said second stripe overlaps said first stripe by a predetermined amount that is less than the width of a stripe.

3. The method as recited in claim 2 wherein said first direction and said second direction are the same, said first and third predetermined positions of said reticle stage are the same, said second and fourth predetermined positions of said wafer stage are the same, and said second stripe overlaps said first stripe.

* * * * *